United States Patent
Pawlowski et al.

[11] Patent Number: 6,099,611
[45] Date of Patent: Aug. 8, 2000

[54] LOCKING ELEMENTS FOR A FILTER VENTILATOR

[75] Inventors: Adam Pawlowski, Eschenburg-Wissenbach; Simone Reuter, Schlierbach, both of Germany

[73] Assignee: Rittal-Werk Rudolf Loh GmbH & Co. KG, Herborn, Germany

[21] Appl. No.: 09/032,507

[22] Filed: Feb. 27, 1998

[30] Foreign Application Priority Data

Feb. 28, 1997 [DE] Germany ............... 197 08 063

[51] Int. Cl.[7] ........................... B01D 35/30
[52] U.S. Cl. ........................... 55/467; 55/507
[58] Field of Search ............... 55/505, 507, 509, 55/495, 471, 467, 473, 490, 508, 385.2, 484; 454/354, 272; 248/27.3; 439/298

[56] References Cited

U.S. PATENT DOCUMENTS

| 2,427,757 | 7/1947 | Klumpp, Jr. ............... 248/27.3 |
| 5,238,427 | 8/1993 | Fry et al. ............... 248/27.3 |
| 5,769,916 | 6/1998 | Immel ............... 55/495 |

FOREIGN PATENT DOCUMENTS 43 12 664 C 1  9/1994  Germany .

*Primary Examiner*—David A. Simmons
*Assistant Examiner*—Robert A. Hopkins
*Attorney, Agent, or Firm*—Jansson, Shupe, Bridge, Munger, Ltd.

[57] ABSTRACT

An improvement to the lock elements of a filter ventilator that is engaged in an opening in a fastening plate in such a manner that a housing part with an outer cross section that corresponds to the cross section of the opening includes a stop flange that limits insertion of a filter on the fastening plate and lock elements arranged on the outside of the housing part wherein the spring-like elements each have a free end attached to the housing part such that the free end is oriented toward a support surface on the rear side of the stop flange, the ends of the lock elements include a plurality of lock stages oriented in a stepped arrangement so as to form a locating section substantially perpendicular to the support surface and a lock section that is substantially parallel to the support surface where the lock sections include spaces of equal width and the locating sections are sized for varying thicknesses of fastening plates, and the lock stage nearest the support surface includes a space with respect to the center axis of the filter ventilator that is the same as or greater than the smallest corresponding dimension of opening in the fastening plate.

18 Claims, 2 Drawing Sheets

LOCKING ELEMENTS FOR A FILTER VENTILATOR

RELATED APPLICATION

This application claims priority from German application no. DE 197 08 063.4-42 filed in the Federal Republic of Germany on Feb. 28, 1997.

1. Field of Invention

The invention relates to a filter housing in general and, more particularly, to a filter ventilator or support for a filter in a switch cabinet.

2. Background of the Invention

A filter ventilator of the type disclosed is known from DE 43 12 664 C1. In the case of this known filter ventilator the housing part always engages with a fastening plate that is of the same thickness. However, in practical application there is no assurance that this condition of installation is always the case. The thickness of the fastening plate can vary within a certain range. In the construction of switch cabinets the filter ventilator can be installed in fastening plates that vary in thickness, e.g., from 1.0 to 2.5 mm. Reliable engagement in fastening plates of varying thickness is not possible with known filters.

OBJECTS OF THE INVENTION

An object of the invention is to provide a filter ventilator that overcomes some of the problems and shortcomings of the prior art.

Another object of the invention is to provide a filter ventilator with locking elements that permit engagement in the opening of fastening plates of varying thickness and that always guarantee a definite, reliable engagement of the filter ventilator in the opening. How these and other objects are accomplished will become apparent from the following descriptions and from the drawings.

SUMMARY OF THE INVENTION

The invention relates to a filter ventilator that engages in an opening in a fastening plate, whereby the outer cross section of a housing part corresponds to the cross section of an opening and features a stop flange that limits the insertion of the filter on the fastening plate, and whereby spring-like lock elements are arranged on the outside of the housing part, projecting beyond its outer cross section and deflecting in the direction of the center axis of the filter ventilator during the insertion of the filter ventilator into the opening. Once in the opening, the lock elements engage behind the fastening plate and as a result of intrinsic elasticity following insertion of the filter ventilator, hold the filter ventilator securely in the opening.

The securing of the filter ventilator in the opening is accomplished according to the invention in that the lock elements are designed as lock springs molded onto the housing with their free ends oriented toward the support surface of the back side of the stop flange. The ends of the lock elements feature a number of lock stages in a stepshaped arrangement that respectively form a locating section that is oriented substantially perpendicular to the support surface and a lock section oriented substantially parallel to the support surface where the lock sections include spaces of equal width and the locating sections are sized for varying thicknesses of fastening plates. Also, the lock sections preferably feature the same width and the lock stage nearest the support surface features, with its locating section, a space relative to the center axis of the filter ventilator that is the same as or greater than the smallest corresponding dimension of the opening in the fastening plate.

The lock elements permit adequate deflection during engagement of the filter ventilator. The stepped ends of the lock elements provide lock stages for predetermined thicknesses within a specific range of thicknesses. These lock stages always provide reliable rear-grasping engagement of the fastening plate through the means of their lock sections. The lock elements also compensate for tolerances in the opening. Care need only be taken that, even if the smallest dimensions of opening and a fastening plate of the slightest thickness is involved, the lock elements will still be able to travel through a predetermined span width. The ends of the lock elements can all be provided with four or more lock stages that can act in conjunction with the corresponding number of fastening plates of varying thickness. The dimension of the opening is thereby always adapted with certain tolerances to the dimension of the outer cross section of the housing part such that the filter ventilator can engage with and reliably fasten onto the most unfavorable opening dimensions.

The selection of the thickness of the fastening plate and the dimensions of the lock stages are, according to one design, implemented such that the lock stages are provided with identical lock sections and identical location sections, whereby an increase in the space between the lock section and the support surface also leads to an increase in the space between the location section and the center axis of the filter ventilator. Lock stages of uniform thickness can be selected, for example, to be 0.5 mm.

If it is provided that the ends of the lock elements with the lock stages are at an apical angle with respect to the location flange and the tip of the angle is directed toward the center axis of the filter ventilator, then the lock elements always deflect entirely in the direction toward the center axis of the filter ventilator during the engagement of the filter ventilator in the opening of the fastening plate. The greater the thickness of the fastening plate, the greater the holding force. This is because the farther the lock spring remains pressed in, the less reverse movement there is.

The lock elements can carry out the required deflection movements unimpaired if it is provided that the lock elements are molded into recesses in the housing part, and that the maximum outside dimension of the housing part in the area of the lock elements is the same as or less than the allocated smallest space between the opening and the center axis of the filter ventilator. It is thereby always assured that the filter ventilator can also be engaged in a opening with the most unfavorable dimensions.

In another embodiment of the invention, the filter ventilator can be designed such that the outer cross section of the housing part is round and bears at least three lock elements displaced by 120 degrees.

In yet another embodiment of the invention, the lock technique can be used with a filter ventilator which is designed so that the outer cross section of the housing part is rectangular and bears each of at least one lock spring at least two opposite sides.

In a preferred embodiment of the invention, the filter ventilator has an overall construction such that the housing part features a receptacle for a filter mat in the area of the stop flange that is covered by a lamellar screen while the ventilator is fastened to the housing part. Such embodiment allows the ventilator to first be attached to the housing part that engages in the opening. The new type of lock connections can be subject to a load opposite the direction of locking, without the housing part loosening from the opening.

In still another embodiment of the invention, the ends of the lock elements include a plurality of lock stages oriented in a stepped arrangement so as to form a locating section substantially perpendicular to the support surface and a lock section that is substantially parallel to the support surface. In such an embodiment, the lock stage nearest the support surface includes a space with respect to the center axis of the filter ventilator that is the same as or greater than the smallest corresponding dimension of opening in the fastening plate. In yet another version of this embodiment, the locating sections are sized for varying thicknesses of fastening plates.

DETAILED DESCRIPTIONS OF PREFERRED EMBODIMENTS

Figure 1:
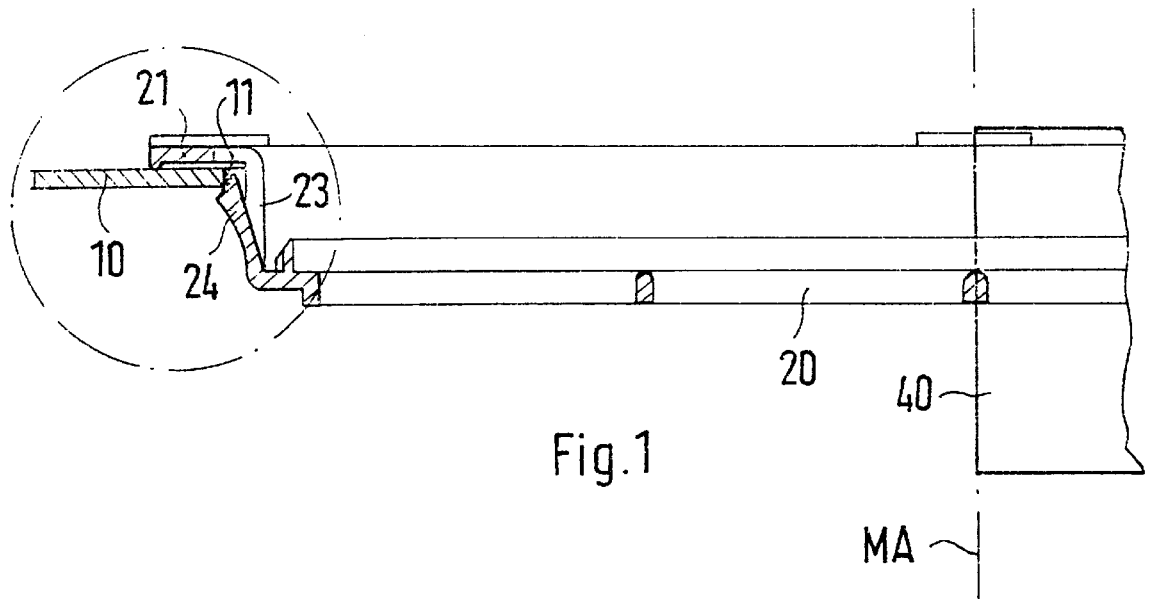
FIG. 1 is a partial section of a housing part of the filter ventilator that is locked in the opening of a fastening plate by means of lock elements.

A fastening plate 10 with a opening 11 can be seen in FIG. 1. A housing part 20 of a filter ventilator 40 engages in opening 11. The filter ventilator 40 is completed when a filter mat and a lamellar screen that covers the filter mat is applied to the front receptacle of the housing part 20. Moreover, a ventilator is attached to the back side of the housing part 20 forming the complete filter ventilator unit as specified by 40 and also locking into the opening 11 as a unit.

The housing part 20 is provided with an outer cross section 26 that features a maximal space gmax to the center axis MA of the filter ventilator in the area of a lock spring 24 that is molded on the housing 20. This space gmax is the same as or smaller than the smallest corresponding space amin of the opening 11 from the center axis MA, so that the filter ventilator 40 can be locked in even when there are unfavorable tolerances of opening 11.

The housing part 20 is provided with a recess 23 in the area of the lock spring 24, into which the lock spring 24 can swivel during engagement of the filter ventilator 40. As is indicated by 25, the lock spring 24 is molded onto the housing part 20 as one piece thus is limited in its swivel in recess 23. The lock spring 24 projects over the outer cross section 26 of the housing part 20, so that during engagement it is always displaced completely into the maximum deflection position.

Figure 2:
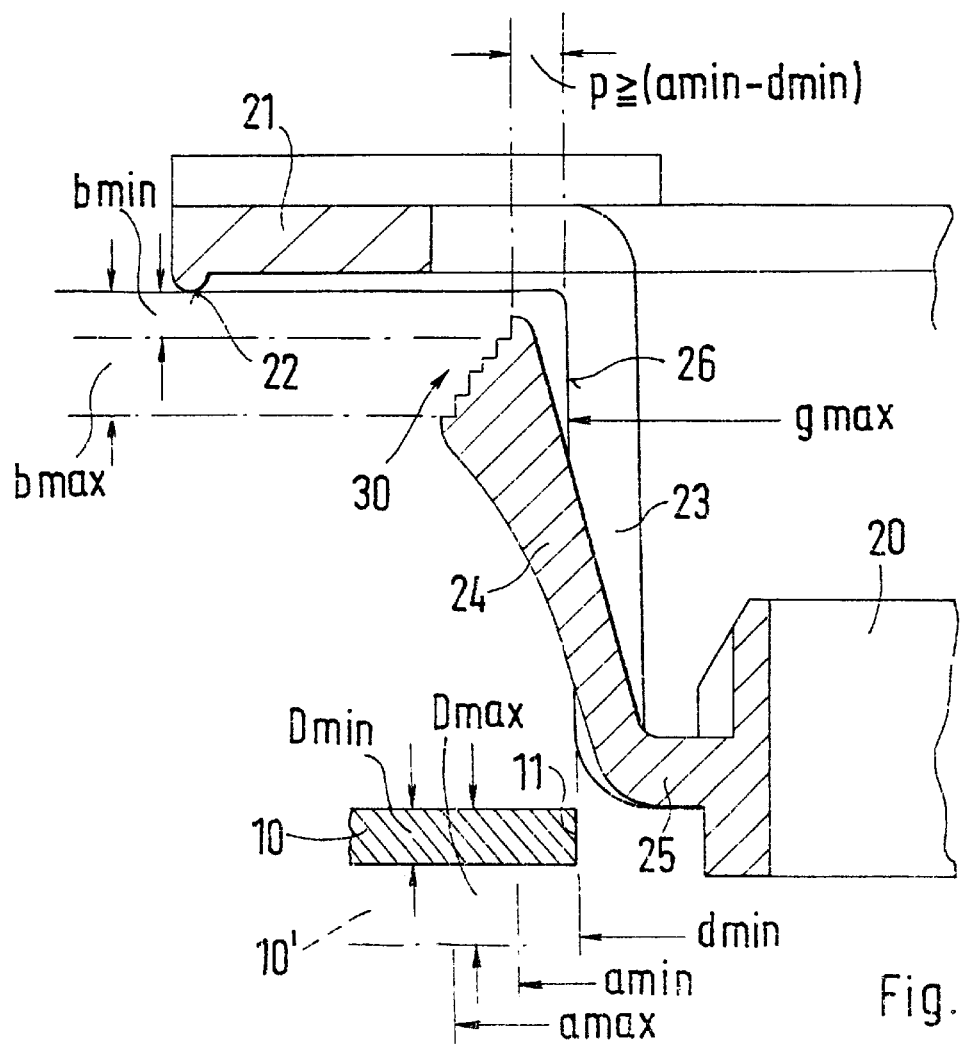
FIG. 2 is an enlarged illustration of a lock connection with a plurality of lock stages.

As is shown in FIG. 2, the filter ventilator 40 with lock elements 24 can be locked into a opening 11 of fastening plates 10 and 10' of varying thicknesses. The opening 11 has a minimal space dmin to the center axis MA of the filter ventilator 40 which is greater than the maximal space gmax of the outer cross section 26 of housing part 20 to the center axis MA of the filter ventilator 40.

The lock spring 24 transitions into a series of lock stages RS1 to RSn at its free end 30 that faces the rear side of a stop flange 21 of the housing part 20. The stop flange 21 forms a support surface 22 on its rear side with webs or the like, thereby limiting the insertion of filter ventilator 40 upon impact on fastening plate 10 or 10'. The thickness of the fastening plate can vary from Dmin to Dmax. The lock stages RS1 to RSn feature locating sections s1 to sn that are directed perpendicular to the support surface 22 and lock sections r1 to rn extend essentially parallel to the support surface 22.

The ends 30 with lock stages RS1 to RSn are essentially at an apical angle with respect to the support surface 22, whereby the tip of the angle points to the center axis MA of the filter ventilator 40. The lock sections r1 to rn feature spaces bmin to bmax with regard to support surface 22 when the lock elements 24 are in the initial position. The spaces bmin to bmax are adapted to thicknesses Dmin to Dmax, so that in each case one of the lock sections r1 to rn grasps the rear of the fastening plate that is used and is securely engaged.

Figure 3:
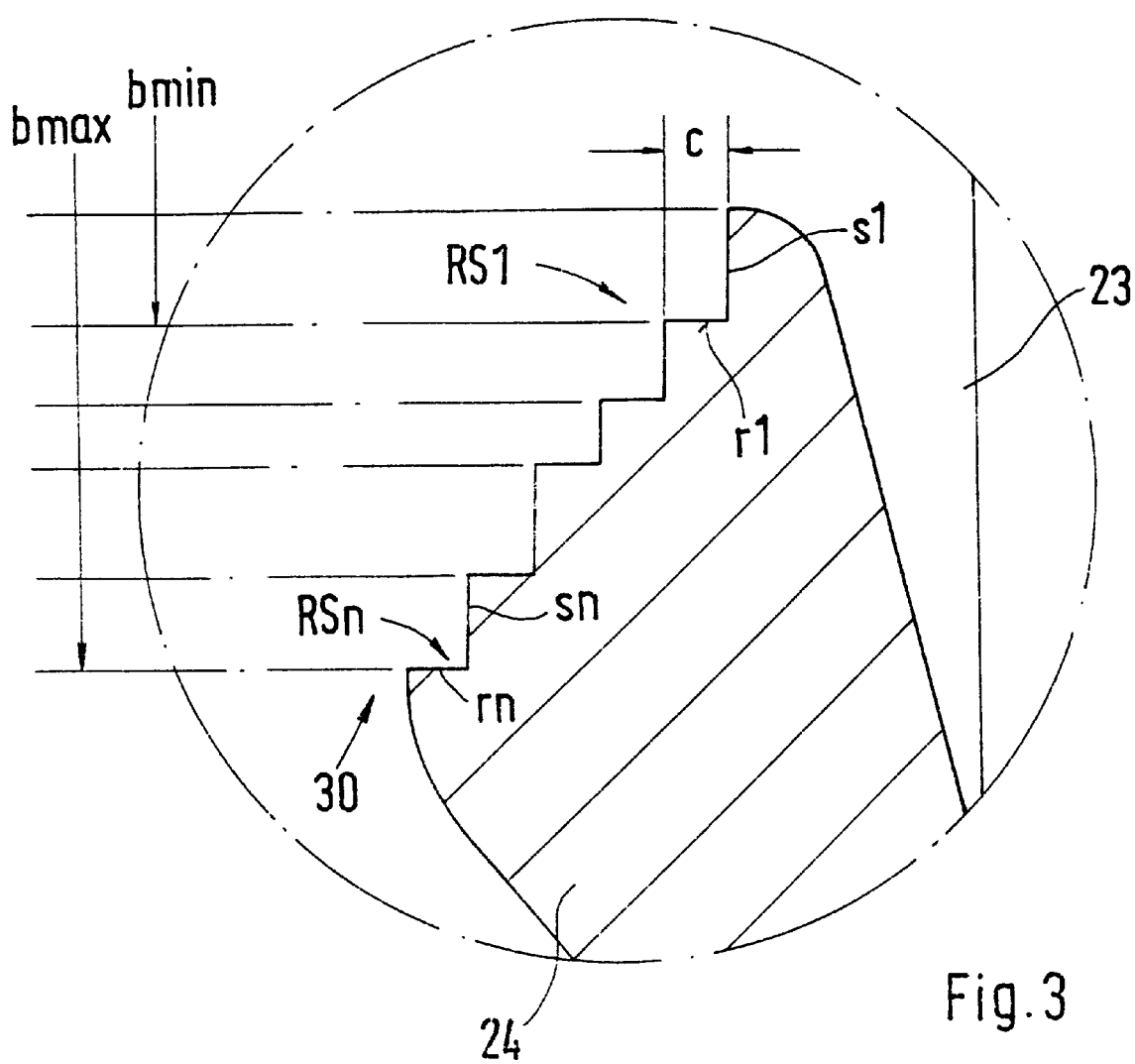
FIG. 3 is a further enlarged illustration showing the design and lay out of the lock stages at the end of a lock spring.

As can be seen in FIG. 3, the lock sections r1 to rn have uniform widths c. The locating sections s1 to sn of lock stages RS1 to RSn have spaces of differing dimensions amin to amax relative to the center axis MA of the filter ventilator 40 when the lock spring 24 is in the initial position. The space amin is advantageously the same or greater than the minimal space dmin of opening 11 for the lock stage RS1 nearest the support surface 22 for a fastening plate 10 with the smallest thickness Dmin. Advantageously, a dimension p is selected for lock spring 24 equal to the difference (amin–dmin). This ensures that a definite engagement is provided, even with the maximal space of opening 11 relative to center axis MA.

With this design of the end 30 of lock spring 24 the lock spring 24 is swiveled around point W in recess 23 when the filter ventilator is engaged, and after engagement it is set back to the extent that the locating section s1 . . . sn corresponding to the fastening plate adjoins the wall of opening 11, thereby automatically compensating for any tolerance. The corresponding lock section r1 . . . rn takes over the grasping of the rear of fastening plate 10 . . . 10'. Regardless of the fastening plate 10 . . . 10' used, the lock spring 24 adjoins the wall of the opening 11 under tension and reliably engages filter ventilator 40 in the opening 11 with the lock stage RS1 . . . RSn that corresponds to fastening plate 10 . . . 10'.

What is claimed:

1. In a filter ventilator having a center axis wherein the filter ventilator is engaged in an opening located in a fastening plate, the opening having a cross section, and the engagement occurring in such a manner that a housing part having an outer cross section that corresponds to the cross section of the opening includes a stop flange that limits insertion of a filter on the fastening plate and lock elements arranged on the outside of the housing part so as to project beyond the outer cross section of the housing part and deflect in the direction of the center axis of the filter ventilator during the insertion of the filter ventilator into the opening and engage behind the fastening plate following insertion of the filter ventilator to hold the filter ventilator securely in the opening, the filter ventilator further comprising:

resilient lock elements each having a free end and being attached to the housing part such that the free end is oriented toward a support surface on the rear side of the stop flange;

the ends of the lock elements include a plurality of lock stages oriented in a stepped arrangement so as to form a locating section substantially perpendicular to the support surface and a lock section that is substantially parallel to the support surface where the lock sections include spaces of equal width and the locating sections are sized for varying thicknesses of fastening plates; and the housing part attached to the lock elements is spaced from the center axis of the filter ventilator by a first distance that is no greater than the distance the lock stage nearest the support surface is spaced from the center axis.

2. The filter ventilator of claim 1 wherein:

the lock stages have identical lock sections and identical locating sections;

the space between the lock sections and the support surface is a first width;

there is a second space between the locating sections and the center axis of the filter ventilator, said second space having a second width; and the relationship between the lock sections and the locating sections is such that an increase in space between the lock sections and the support surface results in an increase in space between the locating sections and the center axis of filter ventilator.

3. The filter ventilator of claim 1 wherein the varying fastening plates have a uniform thicknesses.

4. The filter ventilator of claim 1 wherein:

the lock stages form an apical angle with respect to the support surface of the stop flange and the tip of said angle being oriented toward the center axis of the filter ventilator.

5. The filter ventilator of claim 1 wherein:

the lock elements are molded into recesses of the housing part; and the maximum outer dimension of the housing part in the area of the lock element is the same as or less than the corresponding smallest space of the opening with respect to the center axis of the filter ventilator.

6. The filter ventilator of claim 1 wherein the outer cross section of the housing part is round and has at least three lock elements each displaced by 120 degrees.

7. The filter ventilator of claim 1 wherein the outer cross section of the housing part is rectangular and has at least one lock element on at least two opposite sides.

8. The filter ventilator of claim 1 wherein:

the housing part has a receptacle for a filter mat;

the receptacle is covered in the area of the stop flange by a lamellar screen; and a ventilator is fastened to the housing part.

9. In a filter ventilator having a center axis wherein the filter ventilator is engaged in an opening located in a fastening plate, the opening having a cross section, and the engagement occurring in such a manner that a housing part having an outer cross section that corresponds to the cross section of the opening includes a stop flange that limits insertion of a filter on the fastening plate and lock elements arranged on the outside of the housing part so as to project beyond the outer cross section of the housing part and deflect in the direction of the center axis of the filter ventilator during the insertion of the filter ventilator into the opening and engage behind the fastening plate following insertion of the filter ventilator to hold the filter ventilator securely in the opening, the filter ventilator further comprising:

resilient lock elements each having a free end being attached to the housing part such that the free end is oriented toward a support surface on the rear side of the stop flange;

the ends of the lock elements include a plurality of lock stages oriented in a stepped arrangement so as to form a locating section substantially perpendicular to the support surface and a lock section that is substantially parallel to the support surface; and the housing part attached to the lock elements is spaced from the center axis of the filter ventilator by a first distance that is no greater than the distance the lock stage nearest the support surface is spaced from the center axis.

10. The filter ventilator of claim 9 wherein the locating sections are sized for varying thicknesses of fastening plates.

11. In a filter ventilator configured for retention in a fastening plate, the ventilator including a housing part, a flange extending outwardly from the housing part, and a center axis, the ventilator further comprising:

a plurality of resilient lock springs extending from the housing part toward the flange;

each lock spring including a plurality of lock stages arranged along a line angular to the center axis.

12. The filter ventilator of claim 11 wherein the line angular to the center axis is also angled with respect to the flange.

13. The filter ventilator of claim 12 wherein:

each lock stage includes a locating section; and the locating sections are at differing respective distances from the center axis.

14. The filter ventilator of claim 12 wherein:

each lock stage includes a lock section; and the lock sections are at differing respective distances from the flange.

15. The filter ventilator of claim 13 wherein:

each lock stage includes a lock section; and the lock sections are at differing respective distances from the flange.

16. The filter ventilator of claim 12 in combination with the fastening plate and wherein:

the fastening plate has an edge defining an opening through the plate; and wherein, as to each lock spring:

one lock stage of the plurality of lock stages is within the opening; and another one of the lock stages of the plurality of lock stages is outside the opening.

17. The combination of claim 16 wherein, as to each lock spring, yet another one of the lock stages of the plurality of lock stages engages the edge.

18. The filter ventilator of claim 11 wherein:

each of two of the lock stages of the one of the lock springs includes a locating section parallel to the center axis; and the dimensions of the locating sections, measured generally parallel to the center axis, differ from one another.

* * * * *